(12) United States Patent
Li et al.

(10) Patent No.: US 7,919,015 B2
(45) Date of Patent: Apr. 5, 2011

(54) SILVER-CONTAINING NANOPARTICLES WITH REPLACEMENT STABILIZER

(75) Inventors: Yuning Li, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 331 days.

(21) Appl. No.: 11/543,661

(22) Filed: Oct. 5, 2006

(65) Prior Publication Data

US 2008/0085594 A1    Apr. 10, 2008

(51) Int. Cl.
*H01B 1/22* (2006.01)
(52) U.S. Cl. ........................................ 252/514
(58) Field of Classification Search .................... 252/514
See application file for complete search history.

(56) References Cited

U.S. PATENT DOCUMENTS

| | | | |
|---|---|---|---|
| 5,147,841 A | | 9/1992 | Wilcoxon |
| 6,036,889 A | * | 3/2000 | Kydd ............................. 252/512 |
| 6,103,868 A | | 8/2000 | Heath et al. |
| 6,572,673 B2 | | 6/2003 | Lee et al. |
| 6,688,494 B2 | | 2/2004 | Pozarnsky et al. |
| 7,160,525 B1 | * | 1/2007 | Peng et al. ........................ 423/1 |
| 7,270,694 B2 | | 9/2007 | Li et al. |
| 7,306,969 B2 | | 12/2007 | Wu et al. |
| 7,494,608 B2 | | 2/2009 | Li et al. |
| 2005/0129843 A1 | | 6/2005 | Wu et al. |
| 2006/0073667 A1 | * | 4/2006 | Li et al. ........................... 438/311 |
| 2007/0099357 A1 | | 5/2007 | Li et al. |
| 2008/0085594 A1 | | 4/2008 | Li et al. |

FOREIGN PATENT DOCUMENTS

| | | | |
|---|---|---|---|
| CN | 1266761 | * | 9/2000 |
| JP | 2006-089786 | * | 4/2006 |
| JP | 89786 | | 4/2006 |
| WO | 2006/068019 A1 | | 6/2006 |

OTHER PUBLICATIONS

Yiliang Wu et al., U.S Appl. No. 11/187,552, filed Jul. 22, 2005, titled "Methods to Minimize Contact Resistance.".
P. Buffat and J-P. Borel, "Size effect on the melting temperature of gold particles", *Physical Review A*, vol. 13, No. 6, pp. 2287-2298 (Jun. 1976).
S. B. Fuller, E. J. Wilhelm, and J. M. Jacobson, "Ink-Jet Printed Nanoparticle Microelectromechanical Systems", *Journal of Microelectromechanical Systems*, vol. 11, No. 1, pp. 54-60 (Feb. 2002).
X. Z. Lin, X. Teng, and H. Yang, "Direct Synthesis of Narrowly Dispersed Silver Nanoparticles Using a Single-Source Precursor", *Langmuir*, vol. 19, pp. 10081-10085 (published on web Nov. 1, 2003).
U.S. Appl. No. 11/946,923, filed Nov. 29, 2007, Yuning Li.
U.S. Appl. No. 12/193,203, filed Aug. 18, 2008, Yuning Li.
U.S. Appl. No. 12/193,225, filed Aug. 18, 2008, Yuning Li.

(Continued)

*Primary Examiner* — Mark Kopec
*Assistant Examiner* — Jaison P Thomas
(74) *Attorney, Agent, or Firm* — Zosan S. Soong; Fay Sharpe LLP (57) ABSTRACT

A process including: providing a composition comprising silver-containing nanoparticles and molecules of an initial stabilizer on the surface of the silver-containing nanoparticles; and mixing a replacement stabilizer comprising a carboxylic acid with the composition to replace at least a portion of the initial stabilizer with the replacement stabilizer, resulting in molecules of the replacement stabilizer on the surface of the silver-containing nanoparticles.

11 Claims, 2 Drawing Sheets

OTHER PUBLICATIONS

U.S. Appl. No. 12/369,861, filed Feb. 12, 2009, Mokhtari et al.
U.S. Appl. No. 12/250,727, filed Oct. 14, 2008, Mokhtari et al.
Database WPI Week 200627, Thomson Scientific, London, GB; AN; 2006-258121, XP002533577 & JP 2006 089786 A (Mitsuboshi Belting Ltd) Apr. 6, 2006 (Apr. 29, 2006) *abstract*.
H. Hiramatsu, F.E. Osterloh: "A Simple Large-Scale Synthesis of Nearly Monodisperse Gold and Silver Nanoparticles with Adjustable Sizes and with Exchangeable Surfactants" Chemistry of Materials, vol. 16, No. 13, Jun. 29, 2004 (Jun. 20, 2004), pp. 2509-2511, XP002533575.
Database WPI Week 200067, Thomson Scientific, London, GB; AN 2000-680137; XP002533578 & CN 1 266 761 A (Univ Nanjing) Sep. 20, 2000 *abstract*.
European Search Report mailed Jun. 23, 2009.

* cited by examiner

FIG. 4 under CooperativeAgreement No. 70NANBOH3033 awarded by the National Institute of Standards and Technology (NIST). The United States Government has certain rights in the invention.

SILVER-CONTAINING NANOPARTICLES WITH REPLACEMENT STABILIZER

STATEMENT REGARDING FEDERALLY SPONSORED RESEARCH OR DEVELOPMENT

This invention was made with United States Government support under Cooperative Agreement No. 70NANBOH3033 awarded by the National Institute of Standards and Technology (NIST). The United States Government has certain rights in the invention.

CROSS-REFERENCE TO RELATED APPLICATIONS

Yuning Li et al., U.S. application Ser. No. 10/958,937, filed Oct. 5, 2004, titled "STABILIZED SILVER NANOPARTICLES AND THEIR USE," Publication No. US-2006-0073667-A1.

Yiliang Wu et al., U.S. application Ser. No. 11/187,552, filed Jul. 22, 2005, titled "METHODS TO MINIMIZE CONTACT RESISTANCE."

BACKGROUND OF THE INVENTION

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, etc. However the deposition and/or patterning of functional electrodes, pixel pads, and conductive traces, lines and tracks which meet the conductivity, processing, and cost requirements for practical applications have been a great challenge. Silver is of particular interest as conductive elements for electronic devices because silver is much lower in cost than gold and it possesses much better environmental stability than copper. There is therefore a critical need, addressed by embodiments of the present invention, for lower cost methods for preparing liquid processable, stable silver-containing nanoparticle compositions that are suitable for fabricating electrically conductive elements of electronic devices.

The following documents provide background information:

Yiliang Wu et al., "Printed Silver Ohmic Contacts for High-mobility Organic Thin-film Transistors," *J. Am. Chem. Soc.*, Vol. 128, pp. 4202-4203 (published on web Mar. 9, 2006).

Pozarnsky et al., U.S. Pat. No. 6,688,494.

Lee et al., U.S. Pat. No. 6,572,673 discloses hydrazide as a reducing agent at for example column 1, lines 52-53.

Heath et al., U.S. Pat. No. 6,103,868.

Wilcoxon, U.S. Pat. No. 5,147,841 discloses hydrazine as a reducing agent at for example column 4, line 44.

G. Blanchet and J. Rodgers, "Printed Techniques for Plastic Electronics", *Journal of Imaging Science and Technology*, Vol. 47, No. 4, pp. 296-303 (July/August 2003).

P. Buffat and J-P. Borel, "Size effect on the melting temperature of gold particles", *Physical Review A*, Vol., 13, No. 6, pp. 2287-2298 (June 1976).

C. Hayashi, "Ultrafine Particles", *J. Vacuum Sci. Technol. A*, Vol. 5, No. 4, pp. 1375-1384 (July/August 1987).

S. B. Fuller, E. J. Wilhelm, and J. M. Jacobson, "Ink-Jet Printed Nanoparticle Microelectromechanical Systems", *Journal of Microelectromechanical Systems*, Vol. 11, No. 1, pp. 54-60 (February 2002).

X. Z. Lin, X. Teng, and H. Yang, "Direct Synthesis of Narrowly Dispersed Silver Nanoparticles Using a Single-Source Precursor", *Langmuir*, Vol. 19, pp. 10081-10085 (published on web Nov. 1, 2003).

SUMMARY OF THE DISCLOSURE

There is provided in embodiments a process comprising:
providing a composition comprising silver-containing nanoparticles and molecules of an initial stabilizer on the surface of the silver-containing nanoparticles; and
mixing a replacement stabilizer comprising a carboxylic acid with the composition to replace at least a portion of the initial stabilizer with the replacement stabilizer, resulting in molecules of the replacement stabilizer on the surface of the silver-containing nanoparticles.

In further embodiments, there is provided a process to fabricate an electronic device comprising:
(a) liquid depositing a composition comprising a liquid, silver-containing nanoparticles, a replacement stabilizer comprising a carboxylic acid on the surface of the silver-containing nanoparticles, and a residual amount of an initial stabilizer on the surface of the silver-containing nanoparticles, resulting in a deposited composition; and
(b) heating the deposited composition to form an electrically conductive layer comprising silver.

In additional embodiments, there is provided a thin film transistor comprising in any effective arrangement:
(a) an insulating layer;
(b) a gate electrode;
(c) a semiconductor layer;
(d) a source electrode; and
(e) a drain electrode,
wherein at least one of the source electrode, the drain electrode, and the gate electrode comprises starting ingredients including silver-containing nanoparticles, a replacement stabilizer comprising a carboxylic acid on the surface of the silver-containing nanoparticles, and a residual amount of an initial stabilizer on the surface of the silver-containing nanoparticles.

In embodiments, the present process produces silver-containing nanoparticles stabilized with carboxylic acids which can be fabricated into conductive elements having sufficiently high conductivity for electronic devices at a low temperature such as below about 300° C., particularly lower than about 250° C. The silver-containing nanoparticles prepared in accordance with the present procedures possess in embodiments good stability or shelf life, and can be made into silver-containing nanoparticle compositions with suitable liquids for fabricating liquid-processed conductive elements for electronic devices.

In embodiments, the advantages of the present process for preparing silver-containing nanoparticles are for instance one or more of the following: (i) short reaction times; (ii) reaction temperatures at or close to room temperature (i.e., about 20-25° C.; (iii) stable and liquid processable silver-containing nanoparticle composition; (iv) relatively inexpensive starting materials; and (v) applicable to various carboxylic acids. The silver-containing nanoparticle compositions and the preparative methods for preparing them are suitable for large-scale production and would significantly lower the cost of silver-containing nanoparticles.

The silver-containing nanoparticle compositions prepared using the present process can be easily deposited on substrates by liquid processing techniques such as screen printing, stencil printing, ink-jet printing, microcontact printing, spin-coating, and the like to form deposited features such as lines, tracks, and other patterns after the liquids are evaporated. In embodiments, the resulting silver-containing nanoparticle features at this stage are electrically insulating or with very low conductivity. These insulating or very low conductive features or patterns comprising the silver-containing nanoparticles are then heated to a temperature of for example below about 300° C., particularly lower than about 250° C. to coalesce or fuse the silver-containing nanoparticles in the deposited features or patterns to form conductive elements having thin-film conductivity higher than about 100 S/cm, particularly higher than about 2000 S/cm. The resulting highly conductive elements can be used as electrodes, conductive pads, lines, and the like in electronic devices such as thin film transistor, organic light emitting diodes, RFID tags, photovoltaic, and other electronic devices.

BRIEF DESCRIPTION OF THE DRAWINGS

Other aspects of the present invention will become apparent as the following description proceeds and upon reference to the following figures which depict representative embodiments.

Unless otherwise noted, the same reference numeral in different Figures refers to the same or similar feature.

DETAILED DESCRIPTION

The present process comprises: providing a composition comprising silver-containing nanoparticles and molecules of an initial stabilizer on the surface of the silver-containing nanoparticles; and mixing a replacement stabilizer comprising a carboxylic acid with the composition to replace at least a portion of the initial stabilizer with the replacement stabilizer, resulting in molecules of the replacement stabilizer on the surface of the silver-containing nanoparticles.

The term "nano" as used in "silver-containing nanoparticles" indicates a particle size of less than about 1000 nm. In embodiments, the silver-containing nanoparticles have a particle size of for example from about 0.5 nm to about 1000 nm, from about 1 nm to about 500 nm, from about 1 nm to about 100 nm, and particularly from about 1 nm to about 20 nm. Unless otherwise indicated, the particle sizes described herein are for silver-containing nanoparticles having molecules of the initial stabilizer on the surface thereof and for silver-containing nanoparticles having molecules of the replacement stabilizer on the surface thereof. In the present process, the particle size of the silver-containing nanoparticles may or may not change after mixing the replacement stabilizer. The particle size is defined herein as the average diameter of the silver-containing particles, excluding the initial stabilizer/replacement stabilizer, as determined by TEM (transmission electron microscopy).

Silver-containing nanoparticles may be prepared by any suitable method such as chemical methods and physical methods. For example, silver colloidal nanoparticles of about 5-7 nm in size may be made by physical methods such as that disclosed in C. Hayashi, "Ultrafine Particles", *J. Vacuum Sci. Technol. A*, Vol. 5, No. 4, pp. 1375-1384 (July/August 1987), the disclosure of which is totally incorporated herein by reference.

Chemical methods of making a composition comprising silver-containing nanoparticles in embodiments can involve mixing a silver salt with an initial stabilizer in an aqueous or non-aqueous medium with vigorous agitation, followed by the addition of a reducing agent. Any suitable chemical methods may be used for making a composition comprising silver-containing nanoparticles with molecules of an initial stabilizer on the surface of the silver-containing nanoparticles such as the representative methods disclosed in the following documents (the disclosures of which are totally incorporated herein by reference):

Yiliang Wu et al., U.S. application Ser. No. 11/187,552, filed Jul. 22, 2005, titled "METHODS TO MINIMIZE CONTACT RESISTANCE."

Y. Wu, Y. Li, and B. S. Ong, "Printed Silver Ohmic Contacts for High-Mobility Organic Thin-Film Transistors", *J. Am. Chem. Soc*. vol. 128, 4202-4203 (2006).

X. Z. Lin, X. Teng, H. Yang, "Direct Synthesis of Narrowly Dispersed Silver Nanoparticles Using a Single-Source Precursor", *Langmuir*, vol. 19, 10081-10085 (2003), wherein X. Z. Lin et al reported synthesis of oleic acid-stabilized silver nanoparticles by heating silver trifluoroacetate in the presence of oleic acid in isoamylamine at 160 degrees C.

Y. Wu, Y. Li, and B. S. Ong, "Printed Silver Ohmic Contacts for High-Mobility Organic Thin-Film Transistors", *J. Am. Chem. Soc*. vol. 128, 4202-4203, (2006), wherein Y. Wu et al described a method of preparing silver nanoparticles stabilized with oleic acid by reducing silver acetate using phenylhydrazine in the presence of oleic acid in toluene at a lower temperature (60 degrees C.).

In embodiments, the silver-containing nanoparticles are composed of elemental silver or a silver composite. Besides silver, the silver composite include either or both of (i) one or more other metals and (ii) one or more non-metals. Suitable other metals include for example Al, Au, Pt, Pd, Cu, Co, Cr, In, and Ni, particularly the transition metals for example Au, Pt, Pd, Cu, Cr, Ni, and mixtures thereof. Exemplary metal composites are Au—Ag, Ag—Cu, Au—Ag—Cu, and Au—Ag—Pd. Suitable non-metals in the metal composite include for example Si, C, and Ge. The various components of the silver composite may be present in an amount ranging for example from about 0.01% to about 99.9% by weight, particularly from about 10% to about 90% by weight. In embodiments, the silver composite is a metal alloy composed of silver and one, two or more other metals, with silver comprising for example at least about 20% of the nanoparticles by weight, particularly greater than about 50% of the nanoparticles by weight. Unless otherwise noted, the weight percentages recited herein for the components of the silver-containing nanoparticles do not include the stabilizer, that is, initial stabilizer and/or replacement stabilizer.

Any suitable procedures can be used for fabricating silver composite nanoparticles such as the procedures described in S. Link, Z. L Wang, and M. A. El-Sayed, "Alloy Formation of Gold-Silver Nanoparticles and the Dependence of the Plasmon Absorption on Their Composition", *J. Phys. Chem*. vol. 103, 3529-3533 (1999), the disclosure of which is totally incorporated herein by reference, wherein S. Link et al. describes a method of preparing silver-gold alloy nanoparticles with an average diameter of 17-18 nm by refluxing chlorauric acid ($HAuCl_4$) and silver nitrate ($AgNO_3$) in aqueous sodium citrate solution.

The initial stabilizer on the surface of the silver-containing nanoparticles can be any suitable compound such as a compound comprising a moiety selected from the group consisting of —NH$_2$ such as butylamine, pentylamine, hexylamine, heptylamine, octylamine, nonylamine, decylamine, undecylamine, dodecylamine, tridecylamine, tetradecylamine, pentadecylamine, hexadecylamine, oleylamine, octadecylamine, diaminopentane, diaminohexane, diaminoheptane, diaminooctane, diaminononane, diaminodecane, diaminooctane, —NH— such as dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, polyethyleneimine, an ammonium salt such as tributylammonium bromide, didodecyldimethylammonium bromide, benzyltriethylammonium chloride, —SH such as butanethiol, pentanethiol, hexanethiol, heptanethiol, octanethiol, nonanethiol, decanethiol, undecanethiol, dodecanethiol, —SO$_2$M (M is Li, Na, K, or Cs) such as sodium octylsulfate, sodium dodecylsulfate, —OH (alcohol) such as terpinol, starch, glucose, poly(vinyl alcohol), —C$_5$H$_4$N (pyridyl) such as poly(vinylpyridine), poly(vinylpyridine-co-styrene), poly(vinylpyridine-co-butyl methacrylate), —COOH such as butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, pamitoleic acid, poly(acrylic acid), —COOM (M is Li, Na, or K) such as sodium oleate, elaidate, linoleate, palmitoleate, eicosenoate, stearate, polyacrylic acid, sodium salt), R'R"P— and R'R"P(=O)— (R', R", and R'" are independently an alkyl having for instance 1 to 15 carbon atoms or aryl having for instance 6 to 20 carbon atoms) such as trioctylphosphine and trioctylphosphine oxide, and the like, or a mixture thereof.

The replacement stabilizer is different from the initial stabilizer and the replacement stabilizer can be any suitable carboxylic acid such as, for example, butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, pamitoleic acid, heptadecanoic acid, stearic acid, oleic acid, elaidic acid, linoleic acid, nonadecanoic acid, icosanoic acid, eicosenoic acid, and the like, or a mixture thereof.

The amount of the replacement stabilizer used in the present process can be for example from about 0.01 to about 100 molar equivalents per mole of silver, or from about 0.1 to about 10 molar equivalents per mole of silver, or particularly from about 0.2 to about 5 molar equivalents per mole of silver. The amount of the replacement stabilizer present on the surface of the silver-containing nanoparticles ranges for example from about 1% to about 90% by weight, particularly from about 5% to about 80% by weight, based on the weight of the silver-containing nanoparticles, the replacement stabilizer on the surface thereof, and any residual amount of the initial stabilizer on the surface thereof.

It is understood that the terms "initial stabilizer," "replacement stabilizer," and any substances discussed herein for the "initial stabilizer" and "replacement stabilizer" are starting ingredients which may or may not be chemically transformed in the present process. For example, the resulting silver-containing nanoparticles with replacement stabilizer may contain a residual amount of the initial stabilizer on the surface of the silver-containing nanoparticles, as a free form of the initial stabilizer, or as a complex or a compound that is formed with the replacement stabilizer.

Any suitable liquid(s) may be used in the present process (to help disperse or dissolve) to facilitate for instance those aspects of the present process for: (a) providing a composition comprising silver-containing nanoparticles and molecules of an initial stabilizer on the surface of the silver-containing nanoparticles; and (b) mixing a replacement stabilizer comprising a carboxylic acid with the composition to replace at least a portion of the initial stabilizer with the replacement stabilizer, resulting in molecules of the replacement stabilizer on the surface of the silver-containing nanoparticles. Suitable liquids include for instance organic solvents and/or water. The organic solvents include for example hydrocarbon solvents such as pentane, hexane, cyclohexane, heptane, octane, nonane, decane, undecane, dodecane, tridecane, tetradecane, toluene, xylene, mesitylene, and the like, alcohols such as methanol, ethanol, propanol, butanol and the like, tetrahydrofuran, chlorobenzene, dichlorobenzene, trichlorobenzene, nitrobenzene, cyanobenzene, acetonitrile, and mixtures thereof. The amount of liquid used may be for example from about 5% to about 98% by weight, particularly from about 10% to about 95% by weight of the composition in (a) and/or the reaction mixture in (b).

The mixing of a replacement stabilizer comprising a carboxylic acid with a composition comprising silver-containing nanoparticles with an initial stabilizer on the surface of the silver-containing nanoparticles to replace at least a portion of the initial stabilizer with the replacement stabilizer, resulting in molecules of the replacement stabilizer on the surface of the silver-containing nanoparticles, is carried out at a suitable temperature of for example from about −50° C. to about 200° C., particularly from about 20° C. to about 100° C.

In embodiments, further processing of the composition comprising the silver-containing nanoparticles (with the replacement stabilizer on the surface thereof) may occur such as, for example, making the composition compatible with a liquid deposition technique (e.g., for fabricating an electronic device). Such further processing of the composition comprising the silver-containing nanoparticles (with the replacement stabilizer on the surface thereof) may be for instance: (i) adding the reaction mixture (optionally concentrated by removing partial solvent) to a non-solvent to precipitate the silver-containing nanoparticles; (ii) collecting the silver-containing nanoparticles by filtration or centrifugation; (iii) drying the silver-containing nanoparticles in air or in vacuo; (iv) dissolving or dispersing the isolated silver-containing nanoparticles in appropriate liquids.

Suitable non-solvents that can be used for the precipitation of silver-containing nanoparticles include any liquids that are mixable with the solvents which are used to dissolve the silver-containing nanoparticles in above step (iv) such as for example methanol, ethanol, propanol, acetone, and the like, or a mixture thereof for the silver-containing nanoparticles which are soluble in non-polar solvents such as for example hexane, cyclohexane, and the like. Whether a particular liquid is considered a solvent or non-solvent can change depending on a number of factors including for instance the type of replacement stabilizer and the size of the silver-containing nanoparticles.

In embodiments, the resulting silver-containing nanoparticles with replacement stabilizer contain a residual amount of the initial stabilizer on the surface of the silver-containing nanoparticles, as a free form of the initial stabilizer, or as a complex or a compound that is formed with the replacement stabilizer. If present, the residual amount of the initial stabilizer on the surface of the silver-containing nanoparticles ranges from about 0.001% to about 30% by weight, particularly from about 0.01% to about 10% by weight, based on the weight of the residual initial stabilizer and the replacement stabilizer on the surface of the nanoparticles. The residual amount of the initial stabilizer on the surface of the nanoparticles can be determined by elemental analysis.

Any suitable liquid(s) including for instance organic solvents and water can be used to disperse or dissolve silver-containing nanoparticles to form a silver-containing nanoparticle composition. Suitable organic solvents include hydrocarbon solvents such as pentane, hexane, cyclohexane, heptane, octane, nonane, decane, undecane, dodecane, tridecane, tetradecane, toluene, xylene, mesitylene, and the like; alcohols such as methanol, ethanol, propanol, butanol, pentanol, and the like, ketones such as acetone, butanone, pentanone, cyclohexanone, and the like, tetrahydrofuran, chlorobenzene, dichlorobenzene, trichlorobenzene, nitrobenzene, cyanobenzene, acetonitrile, and mixtures thereof.

The silver-containing nanoparticles having molecules of the replacement stabilizer on the surface thereof are present in an amount ranging for example from about 0.3% to about 90% by weight, or from about 1% to about 70% by weight of composition (e.g., weight of liquid, silver-containing nanoparticles, replacement stabilizer, any residual initial stabilizer, etc.).

The fabrication of conductive elements from the present silver-containing nanoparticle compositions (in embodiments these compositions can be referred to as "inks"), which includes molecules of the replacement stabilizer on the nanoparticle surface, can be carried out in embodiments using any suitable liquid deposition technique including i) printing such as screen/stencil printing, stamping, microcontact printing, ink jet printing and the like, and ii) coating such as spin-coating, dip coating, blade coating, and the like. The deposited silver-containing nanoparticle features at this stage may or may not exhibit electrical conductivity.

Heating the deposited composition or features at a temperature of below about 300° C., preferably at or below about 250° C. causes silver-containing nanoparticles to coalesce to form electrically conductive layers which are suitable for use as conductive elements in electronic devices. The heating is performed for a time ranging from for example about 5 minutes to about 10 hours, particularly from about 10 min to about 1 hour.

The conductivity of the resulting silver-containing elements produced by heating the deposited silver-containing nanoparticle composition is for example more than about 100 S/cm, more than about 500 S/cm, more than about 2 000 S/cm, more than about 5 000 S/cm, more than about 10 000 S/cm, and more than about 20 000 S/cm as measured by four-probe method.

The resulting conductive elements can be used as conductive electrodes, conductive pads, conductive lines, conductive tracks, and the like in electronic devices such as thin film transistor, organic light emitting diodes, RFID (radio frequency identification) tags, photovoltaic, and other electronic devices which require conductive elements or components.

Figure 1:
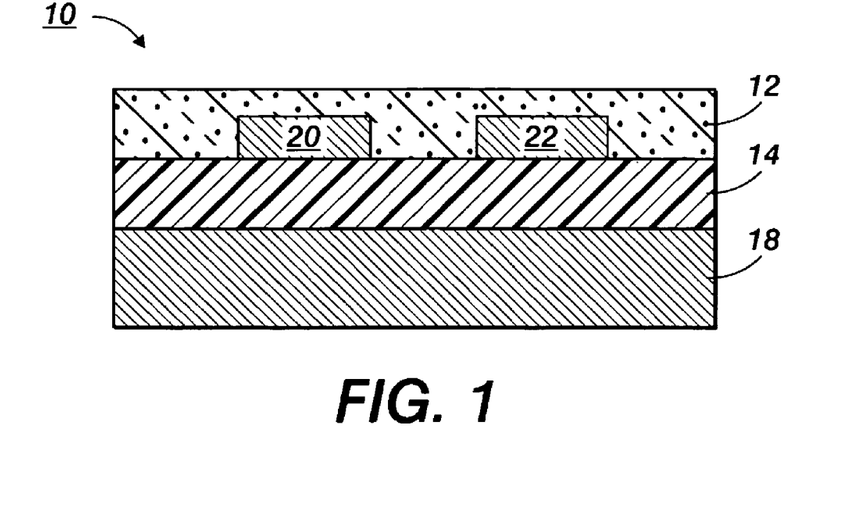
FIG. 1 represents a first embodiment of a thin film transistor fabricated according to the present process.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating layer 14 on top of which are deposited two metal contacts, source electrode 20 and drain electrode 22. Over and between the metal contacts 20 and 22 is a semiconductor layer 12 as illustrated herein.

Figure 2:
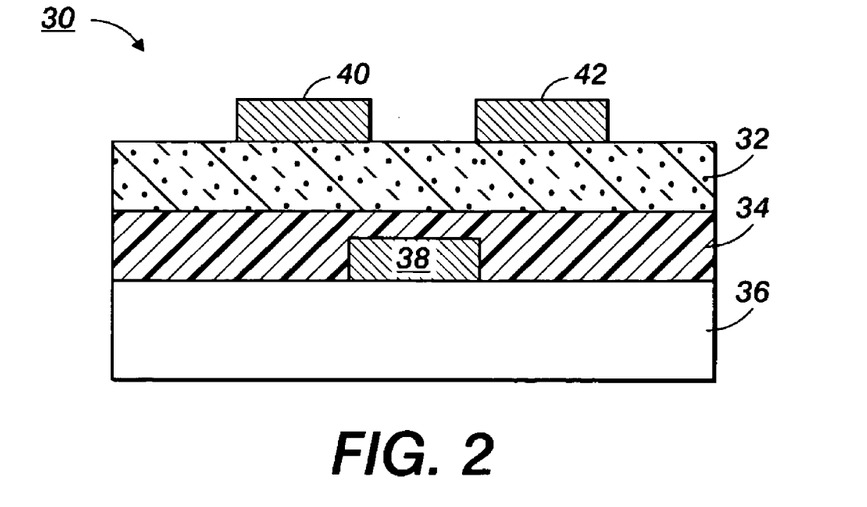
FIG. 2 represents a second embodiment of a thin film transistor fabricated according to the present process.

FIG. 2 schematically illustrates another TFT configuration 30 comprised of a substrate 36, a gate electrode 38, a source electrode 40 and a drain electrode 42, an insulating layer 34, and a semiconductor layer 32.

Figure 3:
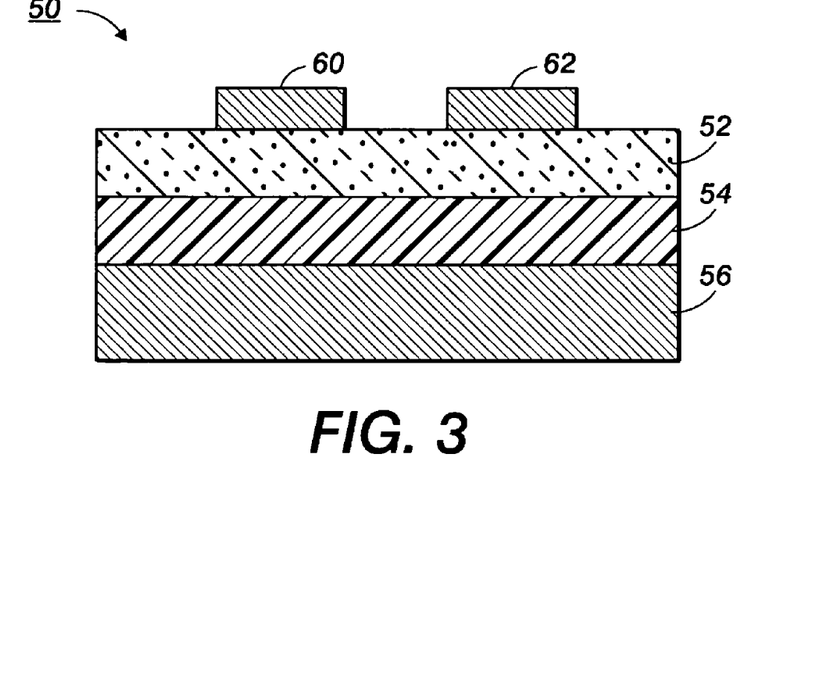
FIG. 3 represents a third embodiment of a thin film transistor fabricated according to the present process.

FIG. 3 schematically illustrates a further TFT configuration 50 comprised of a heavily n-doped silicon wafer 56 which acts as both a substrate and a gate electrode, a thermally grown silicon oxide insulating layer 54, and a semiconductor layer 52, on top of which are deposited a source electrode 60 and a drain electrode 62.

Figure 4:
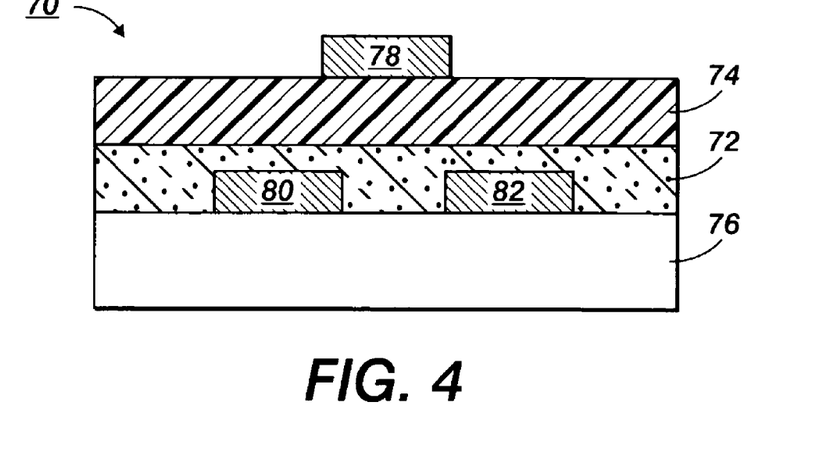
FIG. 4 represents a fourth embodiment of a thin film transistor fabricated according to the present process.

FIG. 4 schematically illustrates an additional TFT configuration 70 comprised of substrate 76, a gate electrode 78, a source electrode 80, a drain electrode 82, a semiconductor layer 72, and an insulating layer 74.

The substrate may be composed of for instance silicon, glass plate, plastic film or sheet. For structurally flexible devices, plastic substrate, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

The gate electrode, the source electrode, and the drain electrode are fabricated by embodiments of the present invention. The thickness of the gate electrode layer ranges for example from about 10 to about 2000 nm. Typical thicknesses of source and drain electrodes are, for example, from about 40 nm to about 1 micrometer with the more specific thickness being about 60 to about 400 nm.

The insulating layer generally can be an inorganic material film or an organic polymer film. Illustrative examples of inorganic materials suitable as the insulating layer include silicon oxide, silicon nitride, aluminum oxide, barium titanate, barium zirconium titanate and the like; illustrative examples of organic polymers for the insulating layer include polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is for example less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligthiophene, pentacene, and the semiconductor polymers disclosed in Beng Ong et al., US Patent Application Publication No. US 2003/0160230 A1; Beng Ong et al., US Patent Application Publication No. US 2003/0160234 A1; Beng Ong et al., US Patent Application Publication No. US 2003/0136958 A1; and "Organic Thin Film Transistors for Large Area Electronics" by C. D. Dimitrakopoulos and P. R. L. Malenfant, *Adv. Mater.*, Vol. 12, No. 2, pp. 99-117 (2002), the disclosures of which are totally incorporated herein by reference. Any suitable technique may be used to form the semiconductor layer. One such method is to apply a vacuum of about $10^{-5}$ to $10^{-7}$ torr to a chamber containing a substrate and a source vessel that holds the compound in powdered form. Heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in Bao et al., U.S. Pat. No. 6,107,117, the disclosure of which is totally incorporated herein by reference.

The invention will now be described in detail with respect to specific embodiments thereof, it being understood that these examples are intended to be illustrative only and the invention is not intended to be limited to the materials, conditions, or process parameters recited herein. All percentages and parts are by weight unless otherwise indicated.

EXAMPLE 1

1) Preparation of Oleylamine-Stabilized Silver Nanoparticles.

Silver acetate (1.67 g, 10 mmol) and oleylamine (6.69 g, 25 mmol) were first dissolved in toluene (20 mL) at 60° C. To this solution was added drop-wise a solution of phenylhydrazine (0.59 g, 5.5 mmol) in toluene (10 mL) with stirring. The resulting reaction mixture which became dark red-brown color was heated at 60° C. for 30 min. The resultant mixture was poured into a mixture of methanol (100 mL) and acetone (100 mL) with stirring. The precipitated solid was collected by filtration and dried in air.

Yield: 1.60 g.

2) Stabilizer-Exchange of Oleylamine-Stabilized Silver Nanoparticles with Carboxylic Acids.

The synthesis of oleic acid-stabilized silver nanoparticles is given below. Silver nanoparticles stabilized with other carboxylic acids were prepared similarly and the results are summarized in Table 1.

The olyelamine-stabilized silver nanoparticles prepared above was dissolved in toluene (30 mL) and was added drop-wise to a solution of oleic acid (8.47 g, 30 mmol) in toluene (50 mL) at room temperature with stirring. After 15 min, the mixture was poured into a stirring methanol (350 mL). After filtration and drying under vacuum (room temperature for 30 min), a dark grey solid was obtained. Yield: 1.48 g.

3) Fabrication and Annealing of Thin Films of Carboxylic Acid-Stabilized Silver Nanoparticles.

Carboxylic acid-stabilized silver nanoparticles prepared above were dissolved in cyclohexane (10-15 wt %) and filtered (filter pore size: 1 µm). The solution was spin-coated on a glass substrate at a speed of 1000 rpm for 120 seconds. The substrate with a thin layer of dark brown silver nanoparticles was heated on a hotplate at 220° C. for 10-20 min in air. A silver thin film was then obtained. The thickness of silver thin films is about 80-180 nm. The conductivity of the silver thin films was measured using a conventional four-probe technique.

TABLE 1

Synthesis and properties of silver nanoparticles stabilized with various carboxylic acids.

| Run No. | Carboxylic acid | Yield, g[a] | Conductivity × $10^4$, S/cm |
|---|---|---|---|
| 1 | Oleic acid ($C_{17}H_{33}COOH$) | 1.48 | 2.9 |
| 2 | Stearic acid ($C_{17}H_{35}COOH$) | 1.43 | 1.2 |
| 3 | Palmitic acid ($C_{15}H_{31}COOH$) | 1.48 | 2.1 |
| 4 | Myristic acid ($C_{13}H_{27}COOH$) | 1.38 | 1.8 |
| 5 | Lauric acid ($C_{11}H_{23}COOH$) | 1.28 | 0.9 |

[a]Obtained from 10 mmol of silver acetate.
[b]in cyclohexane

Table 1 shows that silver nanoparticles with various carboxylic acids replacement stabilizers were prepared in high yields. The thin films made from silver nanoparticles could be transformed to highly electrically conductive thin films upon annealing at 220° C. for 10-20 min in air, with conductivity ranging from $9 \times 10^3$ to $2.9 \times 10^4$ S/cm.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:
1. A process comprising:
providing a composition comprising silver-containing nanoparticles and molecules of an initial stabilizer on the surface of the silver-containing nanoparticles;
mixing a replacement stabilizer comprising a carboxylic acid with the composition to form a reaction mixture and to replace at least a portion of the initial stabilizer with the replacement stabilizer, resulting in molecules of the replacement stabilizer on the surface of the silver-containing nanoparticles;
adding the reaction mixture to a non-solvent to precipitate the silver-containing nanoparticle wherein the non-solvents are selected from the group consisting of methanol, ethanol, propanol, acetone and mixtures thereof; and
collecting the silver-containing nanoparticles.
2. The process of claim 1, wherein the size of the silver-containing nanoparticles is from about 0.5 nm to about 1000 nm.
3. The process of claim 1, wherein the size of the silver-containing nanoparticles is from about 1 nm to about 100 nm.
4. The process of claim 1, wherein the initial stabilizer is a compound comprising a moiety selected from selected from the group consisting of —$NH_2$, —NH—, —SH, —$C_5H_4N$, —COOH, —COOM, R'R"P—, R'R" P(=O)—, and mixtures thereof, wherein M is Li, Na, or K, and wherein R' and R" are independently an alkyl or aryl.
5. The process of claim 1, wherein the initial stabilizer comprises an organoamine.
6. The process of claim 1, wherein the initial stabilizer comprises octylamine, nonylamine, decylamine, undecylamine, dodecylamine, tridecylamine, tetradecylamine, pentadecylamine, hexadecylamine, oleylamine, octadecylamine, and mixtures thereof.

7. The process of claim 1, wherein the initial stabilizer comprises a carboxylic acid that is different from the carboxylic acid of the replacement stabilizer.

8. The process of claim 1, wherein the carboxylic acid comprises from 1 to about 50 carbon atoms.

9. The process of claim 1, wherein the carboxylic acid comprises from about 4 to about 20 carbon atoms.

10. A process comprising:
   providing a composition comprising silver-containing nanoparticles and molecules of an initial stabilizer on the surface of the silver-containing nanoparticles;
   mixing a replacement stabilizer comprising a carboxylic acid with the composition to form a reaction mixture and to replace at least a portion of the initial stabilizer with the replacement stabilizer, resulting in molecules of the replacement stabilizer on the surface of the silver-containing nanoparticles;
   adding the reaction mixture to a non-solvent to precipitate he silver-containing nanoparticles; and
   collecting the silver-containing nanoparticles;
   wherein the carboxylic acid comprises butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, or icosanoic acid, or mixtures thereof.

11. The process of claim 1, wherein there is a residual amount of the initial stabilizer on the surface of the silver-containing nanoparticles, after the mixing of the replacement stabilizer.

\* \* \* \* \*

UNITED STATES PATENT AND TRADEMARK OFFICE
CERTIFICATE OF CORRECTION

PATENT NO. : 7,919,015 B2  
APPLICATION NO. : 11/543661  
DATED : April 5, 2011  
INVENTOR(S) : Yuning Li et al.

Page 1 of 1

It is certified that error appears in the above-identified patent and that said Letters Patent is hereby corrected as shown below:

In the Specification

Column 1, line 8, after "Cooperative Agreement No.", please delete "70NANBOH3033" and insert -- 70NANB0H3033 --.

Signed and Sealed this  
Tenth Day of September, 2013

Teresa Stanek Rea  
*Acting Director of the United States Patent and Trademark Office*